(12) United States Patent
Tu et al.

(10) Patent No.: US 8,378,441 B2
(45) Date of Patent: Feb. 19, 2013

(54) MANUFACTURING METHOD AND STRUCTURE OF A WAFER LEVEL IMAGE SENSOR MODULE WITH PACKAGE STRUCTURE

(75) Inventors: Hsiu-Wen Tu, Hsin-Chu Hsien (TW); Chung-Hsien Hsin, Hsin-Chu Hsien (TW); Han-Hsing Chen, Hsin-Chu Hsien (TW); Ming-Hui Chen, Hsin-Chu Hsien (TW); Ren-Long Kuo, Hsin-Chu Hsien (TW); Chih-Cheng Hsu, Hsin-Chu Hsien (TW); Young-Houng Shiao, Hsin-Chu Hsien (TW); Tsao-Pin Chen, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 280 days.

(21) Appl. No.: 13/010,880

(22) Filed: Jan. 21, 2011

(65) Prior Publication Data
US 2011/0241146 A1   Oct. 6, 2011

Related U.S. Application Data

(60) Provisional application No. 61/321,217, filed on Apr. 6, 2010, provisional application No. 61/334,254, filed on May 13, 2010.

(51) Int. Cl.
*H01L 33/0232* (2006.01)
*H01L 21/00* (2006.01)

(52) U.S. Cl. ............... 257/432; 257/433; 257/E31.127; 438/65

(58) Field of Classification Search .................. 257/432, 257/433, E31.127; 438/64, 65
See application file for complete search history.

(56) References Cited

U.S. PATENT DOCUMENTS

| 8,189,277 | B2* | 5/2012 | Kintz et al. | 359/797 |
| 2011/0204462 | A1* | 8/2011 | Borthakur et al. | 257/432 |
| 2011/0279815 | A1* | 11/2011 | Tu et al. | 356/213 |

* cited by examiner

*Primary Examiner* — Minh-Loan T Tran
(74) *Attorney, Agent, or Firm* — Stites & Harbison, PLLC; Juan Carlos A. Marquez, Esq

(57) ABSTRACT

The present invention discloses a manufacturing method and structure of a wafer level image sensor module with package structure. The structure of the wafer level image sensor module with package structure includes a semi-finished product, a plurality of solder balls, and an encapsulant. The semi-finished product includes an image sensing chip and a wafer level lens assembly. The encapsulant is disposed on lateral sides of the image sensing chip and the wafer level lens assembly. Also, the manufacturing method includes the steps of: providing a silicon wafer, dicing the silicon wafer, providing a lens assembly wafer, fabricating a plurality of semi-finished products, performing a packaging process, mounting the solder balls, and cutting the encapsulant. Accordingly, the encapsulant encapsulates each of the semi-finished products by being disposed on the lateral sides thereof.

20 Claims, 16 Drawing Sheets

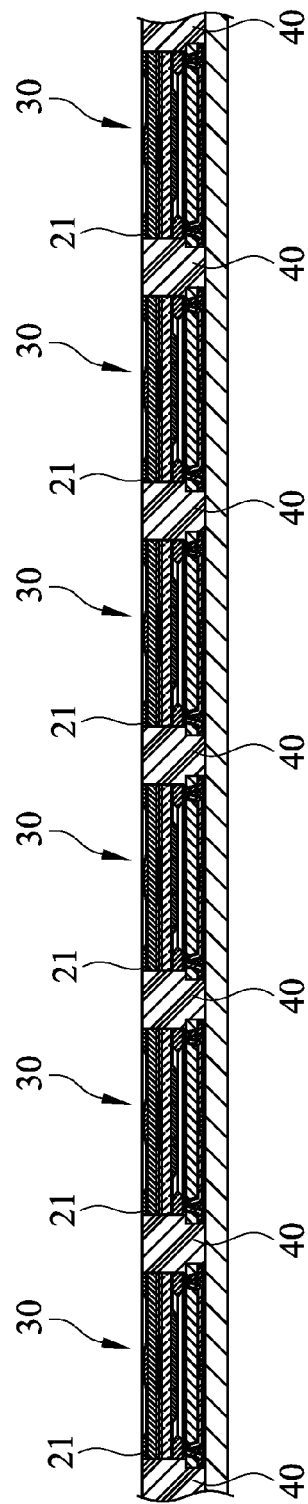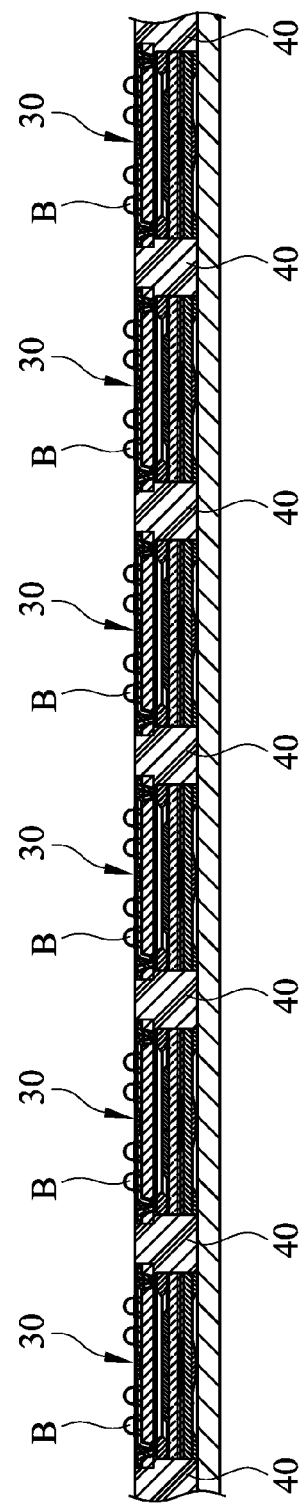

MANUFACTURING METHOD AND STRUCTURE OF A WAFER LEVEL IMAGE SENSOR MODULE WITH PACKAGE STRUCTURE

BACKGROUND OF THE INVENTION

1. Field of the Invention

The present invention relates to manufacturing methods and structures of a wafer level image sensor module with package structure, and more particularly, to a manufacturing method and structure of an image sensor module with an encapsulant coupled to a lateral side of the module.

2. Description of the Prior Art

Mobile devices equipped with an image retrieving unit are all the rage, and thus image retrieval is indispensable to portable electronic devices nowadays, such as notebook computers, cellular phones, and PDA. In this regard, the quality of an image retrieving unit depends on the performance of an image sensor module inside the image retrieving unit. In turn, the performance of an image sensor module extremely depends on an image sensing chip package therein.

The purpose of packaging is to prevent an image sensor module from being damaged by an external force or for an environmental reason in the course of use, and provide electrical connection between the image sensor module and an external device to thereby enable signal transmission.

However, various packaging methods in use have drawbacks or rooms for improvement as follows:

1. Space: a conventional chip-on-board (COB) package occupies relatively large space, because it comprises metal wires for use in wire bonding; a conventional COB package involves adhering an image sensing chip to a substrate or a circuit board, and thus it is difficult to reduce the total height of the package (i.e., the sum of the height of the package and the height of the substrate or circuit board); in an attempt to solve the problem with the space-consuming wire bonding structure based on COB packaging, a combination of a chip scale package structure and a wafer level lens assembly package (CSP+WLO) was put forth but found to be ineffective in reducing the total height of the module, because a chip scale package (CSP) structure requires a piece of glass for protecting a chip sensing region, and thus the total optical focal length increases with the glass thickness; also, COB packaging requires a substrate or a circuit board and therefore incurs manufacturing costs.

2. Side light leakage: all conventional packaging methods are susceptible to side light leakage and thus require an extra light mask or a masking layer coated on one side of a lens assembly; as a result, the extra light mask or coating not only incurs raw material costs but also increases the steps of a working procedure.

3. Focusing: conventional packaging methods entail performing the step of focusing by means of a focusing unit in order to focus on the image sensing chip; however, this step requires a specific apparatus and work procedure which incur costs.

SUMMARY OF THE INVENTION

The present invention relates to a manufacturing method and structure of a wafer level image sensor module with package structure. As disclosed in the present invention, the manufacturing method and structure of a wafer level image sensor module with package structure do not require wire bonding and thus are conducive to reduction of package scale such that the wafer level image sensor module package structure of the present invention approximates to the image sensing chip scale. Furthermore, the present invention dispenses with a substrate, and thus the wafer level image sensor module package structure of the present invention is of a total height less than a conventional COB package. Since the present invention dispenses with a substrate, the present invention is advantageously characterized by a reduction in the required materials and material costs.

Unlike CSP+WLO, the manufacturing method and structure of the wafer level image sensor module with package structure of the present invention does not require a piece of glass and thus is capable of reducing its total height and effectuating space saving. In addition, the manufacturing method and structure of the wafer level image sensor module with package structure of the present invention involve using a wafer level lens assembly which has a specific focal length and is fabricated and tested to the full in advance; hence, the present invention dispenses with an image focusing process and reduces the costs and work which might otherwise be incurred and required by a focusing unit, respectively.

In addition, the present invention proposes using an encapsulant of a low transmittance for encapsulating the lateral sides of an image sensor module directly and thus precluding side light leakage, not to mention that the present invention does not require an extra light mask or masking layer, thereby reducing work and costs which might otherwise be required and incurred, respectively.

Moreover, the present invention discloses encapsulating the lateral sides of an image sensor module with an encapsulant to reinforce the package structure and thus prevents structure problems from happening to the image sensor module, such as the cracking of an image sensing chip due to its inadequate thinness.

In order to achieve the above and other objectives, the present invention provides a manufacturing method of a wafer level image sensor module with package structure. The method comprises the steps of: providing a silicon wafer comprising a plurality of image sensing chips, the image sensing chips each comprising an image sensing region and a plurality of sorldering pads; dicing the silicon wafer to divide the silicon wafer into the image sensing chips; providing a lens assembly wafer comprising a plurality of wafer level lens assemblies; fabricating a plurality of semi-finished products each have at least one said wafer level lens assembly, wherein the wafer level lens assembly corresponds in position to at least one said image sensing region and is disposed on a corresponding one of the image sensing chips so as to be coupled thereto; performing a packaging process by filling an encapsulant between the semi-finished products such that the encapsulant only encapsulates a lateral side of each of the semi-finished products; mounting solder balls on the sorldering pads; and cutting the encapsulant between the semi-finished products so as to separate the semi-finished products.

In order to achieve the above and other objectives, the present invention further provides a structure of a wafer level image sensor module with package structure, comprising: a semi-finished product, comprising: an image sensing chip comprising an image sensing region and a plurality of sorldering pads, wherein the image sensing region and the sorldering pads face opposite directions; a wafer level lens assembly coupled to the image sensing chip and corresponding in position to the image sensing region; and a plurality of solder balls mounted on the sorldering pads, respectively; and an encapsulant for encapsulating each of the semi-finished products by being disposed on lateral sides thereof.

Implementation of the present invention at least involves the following inventive steps:

1. reducing package scale, so as for packaged volume to approximate to image sensing chip scale;

2. reducing package height, so as to reduce the total volume of a wafer level image sensor module;

3. dispensing with a substrate, gold wires, and a light mask and thereby using less materials and cutting costs;

4. solving the problem with side light leakage and thereby dispensing with light masks or masking layers;

5. enabling batch production, enhancing the conforming rate, and being fit for mass production.

6. dispensing with a focusing unit and thereby reducing the costs and work which might otherwise be incurred and required, respectively.

7. Encapsulating a wafer level image sensor module, and lateral sides of an image sensing chip in particular, with an encapsulant, so as to prevent the image sensing chip from cracking.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

FIG. 9 is a schematic view of the wafer level image sensor module with package structure filled with an encapsulant according to an embodiment of the present invention;

FIG. 10 is a schematic view of the wafer level image sensor module with package structure mounted thereon with solder balls according to an embodiment of the present invention;

DETAILED DESCRIPTION OF THE EMBODIMENTS

Figure 1:
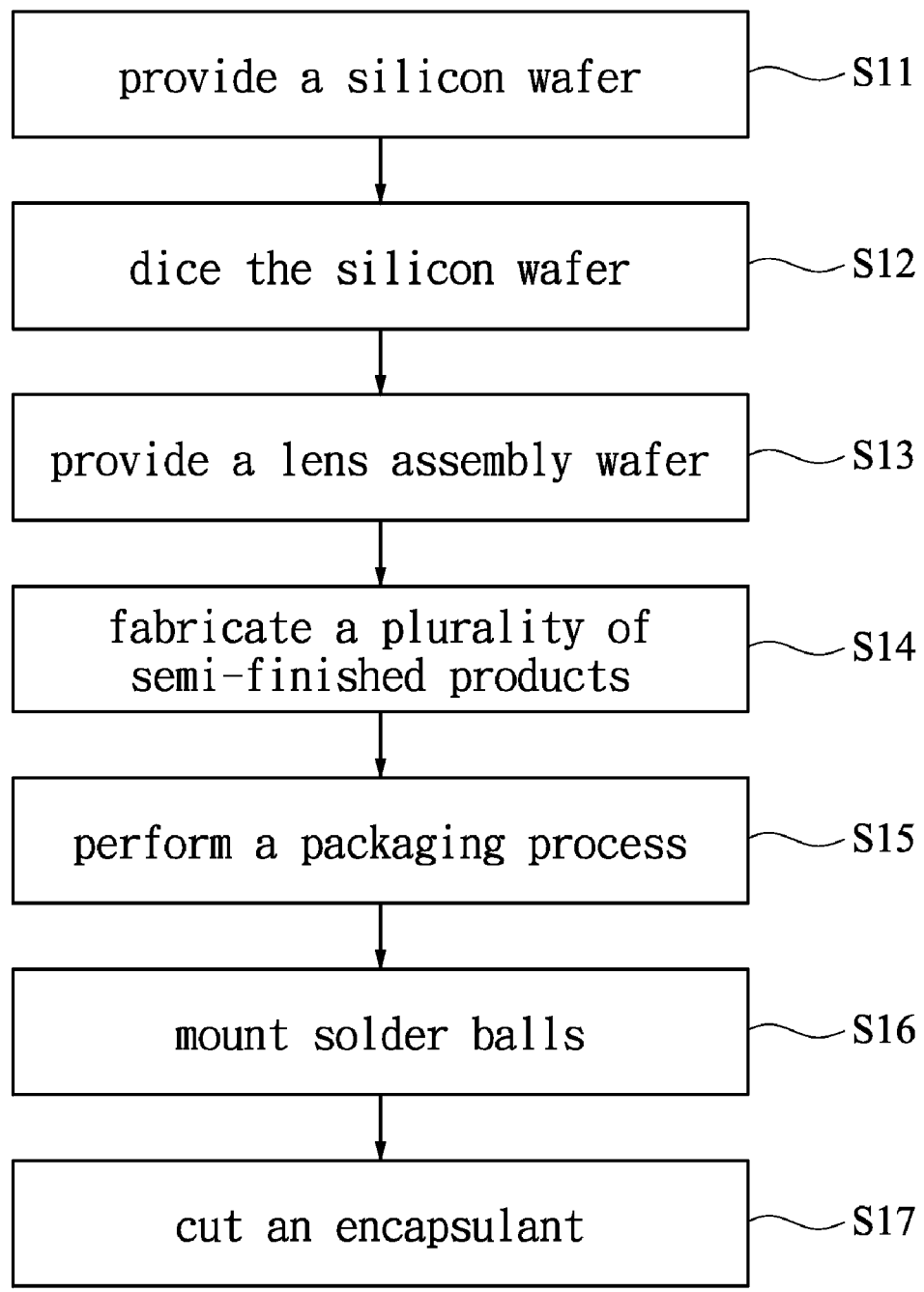
FIG. 1 is a flow chart of a manufacturing method of a wafer level image sensor module with package structure according to an embodiment of the present invention.

The present invention provides, in this embodiment, a manufacturing method and structure of a wafer level image sensor module with package structure. Referring to FIG. 1, there is shown a flow chart of a manufacturing method of a wafer level image sensor module with package structure. The method of the present invention comprises the steps of: providing a silicon wafer (S11); dicing the silicon wafer (S12); providing a lens assembly wafer (S13); fabricating a plurality of semi-finished products (S14); performing a packaging process (S15); mounting a plurality of solder balls (S16); and cutting an encapsulant (S17).

Figure 2:
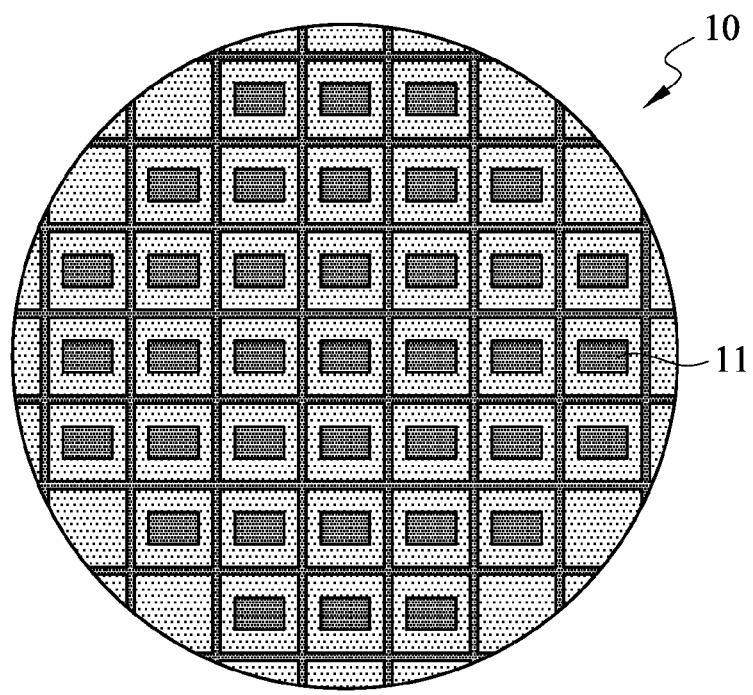
FIG. 2 is a schematic view of a silicon wafer of a wafer level image sensor module with package structure according to an embodiment of the present invention.
Figure 3:
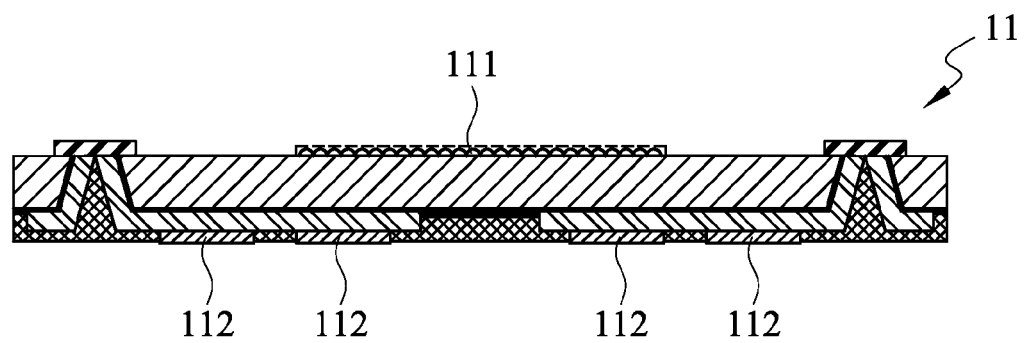
FIG. 3 is a schematic side view of an image sensing chip of the wafer level image sensor module with package structure according to an embodiment of the present invention.

The step of providing a silicon wafer (S11) is described hereunder. Referring to FIG. 2 and FIG. 3, a silicon wafer 10 comprises a plurality of image sensing chips 11, and the image sensing chips 11 each comprise an image sensing region 111 and a plurality of sorldering pads 112. The image sensing region 111 and the sorldering pads 112 are disposed on opposing sides of the image sensing chips 11.

Figure 4:
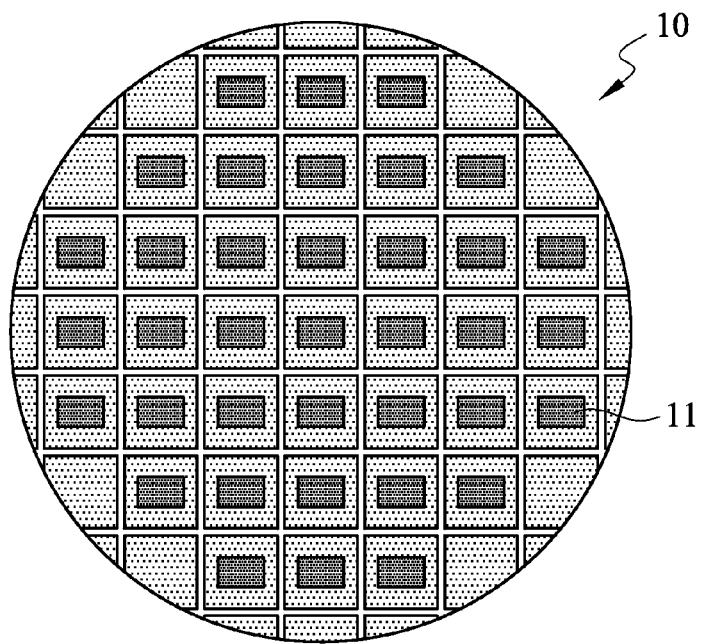
FIG. 4 is a schematic view of the diced silicon wafer of the wafer level image sensor module with package structure according to an embodiment of the present invention.

The step of dicing the silicon wafer (S12) is described hereunder. Referring to FIG. 4, the silicon wafer 10 is cut to separate the image sensing chips 11.

Figure 5:
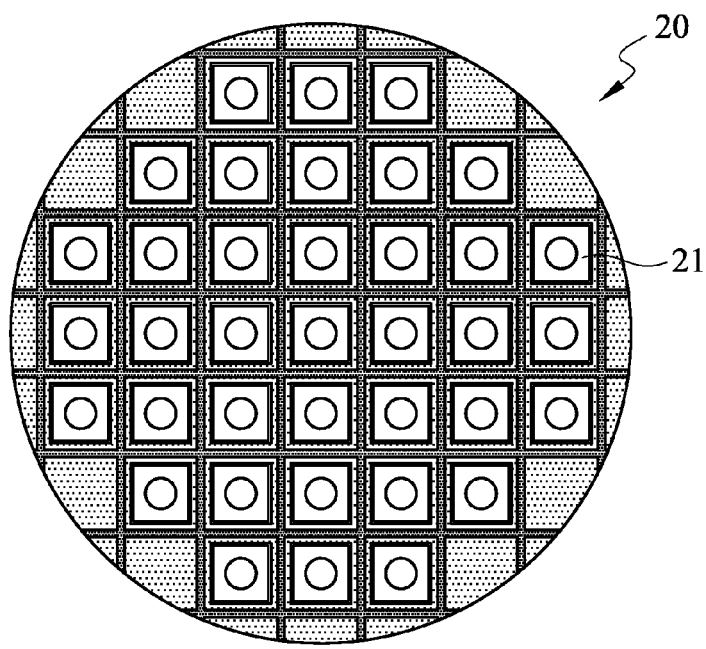
FIG. 5 is a schematic view of a lens assembly wafer of the wafer level image sensor module with package structure according to an embodiment of the present invention.
Figure 6:
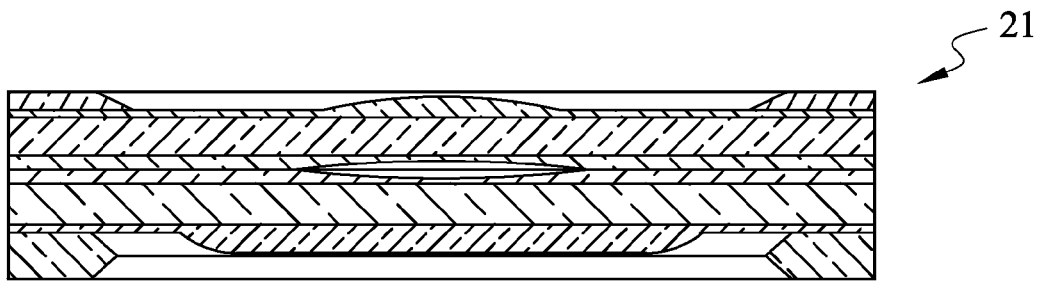
FIG. 6 is a side view of a wafer level lens assembly of the wafer level image sensor module with package structure according to an embodiment of the present invention.

The step of providing a lens assembly wafer (S13) is further described hereunder. Referring to FIG. 5 and FIG. 6, a lens assembly wafer 20 comprises a plurality of wafer level lens assemblies 21.

Figure 7:
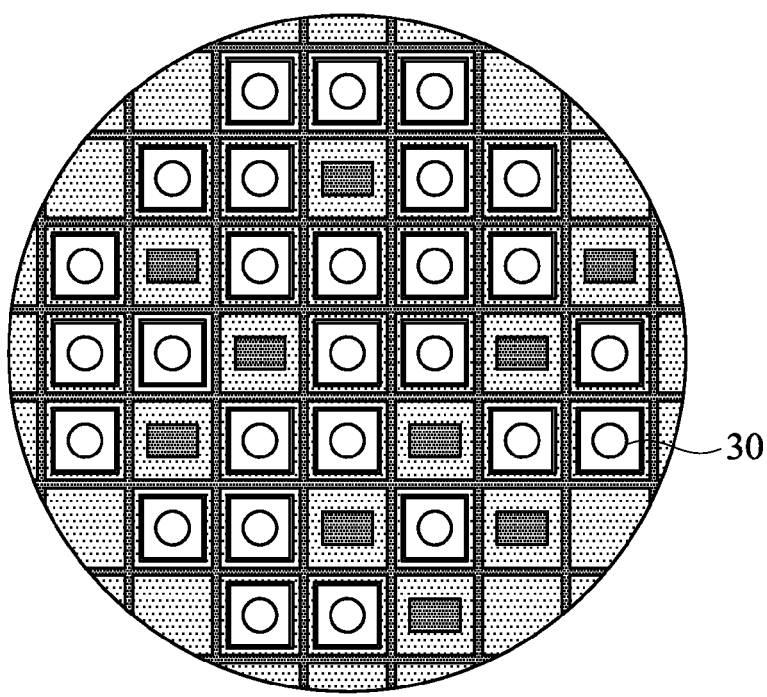
FIG. 7 is a schematic view of a semi-finished product of the wafer level image sensor module with package structure according to an embodiment of the present invention.
Figure 8:
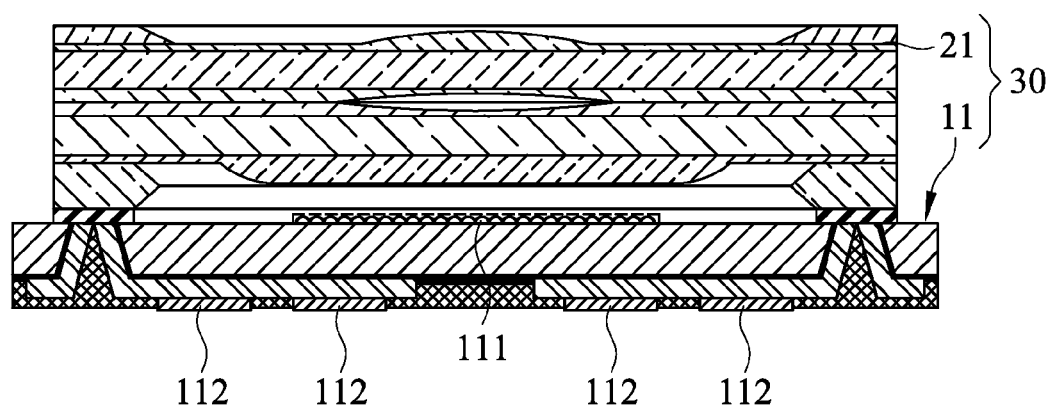
FIG. 8 is a side view of the semi-finished product of the wafer level image sensor module with package structure according to an embodiment of the present invention.

The step of fabricating a plurality of semi-finished products (S14) is described hereunder. Referring to FIG. 7 and FIG. 8, the semi-finished products 30 each comprise one said wafer level lens assembly 21 and one said image sensing chip 11. The wafer level lens assembly 21 corresponds in position to at least one said image sensing region 111 and is disposed on the image sensing chip 11. Also, it is feasible to select, by quality grading selection, appropriate ones of the wafer level lens assemblies 21 and the image sensing chips 11. A high-quality one of the wafer level lens assemblies 21 and a high-quality one of the image sensing chips 11 are coupled together to form a corresponding one of the semi-finished products 30, so as to increase the conforming rate of the products. In addition, the wafer level lens assemblies 21 are fabricated and tested in advance, so that the fabrication process dispenses with an imaging focusing process, thereby reducing investment otherwise required for the focusing unit and the focusing manpower costs.

The step of performing a packaging process (S15) is described hereunder. Referring to FIG. 9, the step of performing a packaging process entails filling an encapsulant 40 between the semi-finished products 30 such that the encapsulant 40 merely encapsulates lateral sides of each of the semi-finished products 30. The encapsulant 40 is even with the top ends and the bottom ends of the semi-finished products 30, and thus the encapsulant 40 does not cover the wafer level lens assemblies 21 from above.

Figure 11:
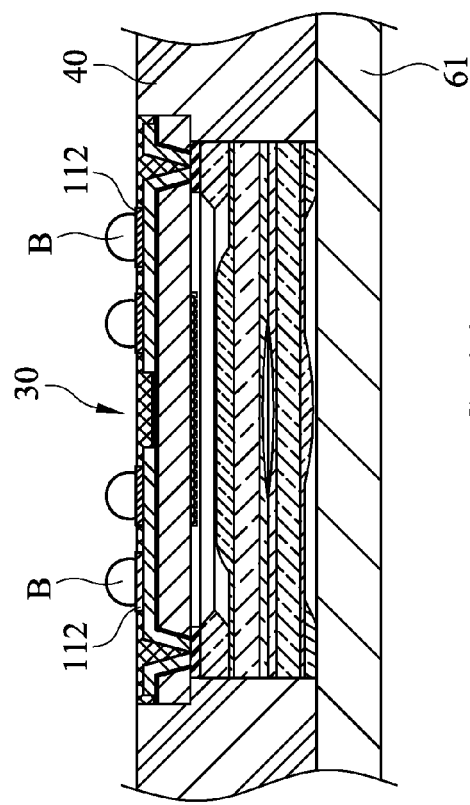
FIG. 11 is a schematic view of a single image sensor of the wafer level image sensor module with package structure mounted thereon with solder balls according to an embodiment of the present invention.

The step of mounting a plurality of solder balls (S16) is described hereunder. Referring to FIG. 10 and FIG. 11, after the encapsulant 40 has encapsulated the lateral sides of each of the semi-finished products 30, a plurality of solder balls B are mounted on the sorldering pads 112, respectively.

Figure 12:
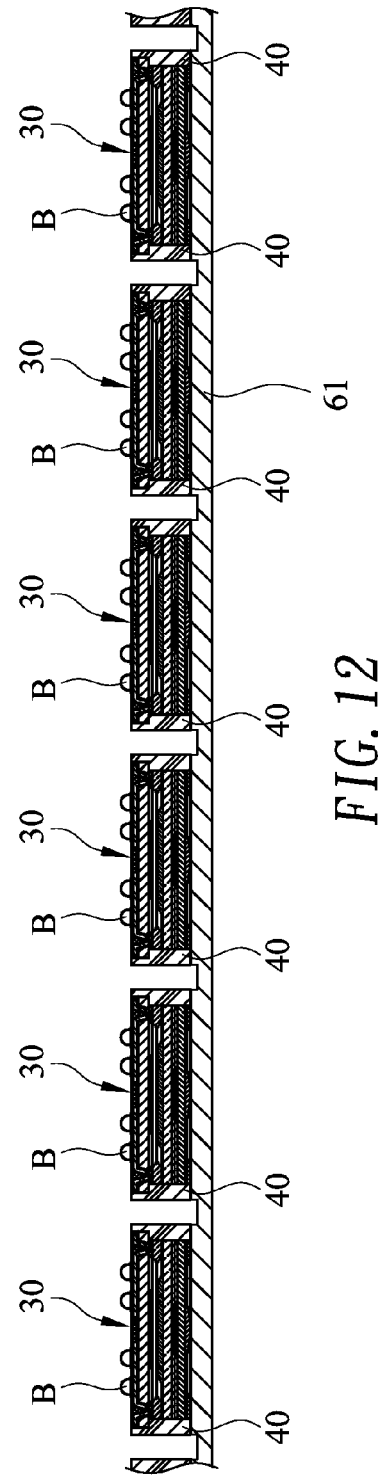
FIG. 12 is a schematic view of the wafer level image sensor module with package structure filled with the encapsulant which is cut according to an embodiment of the present invention.
Figure 13:
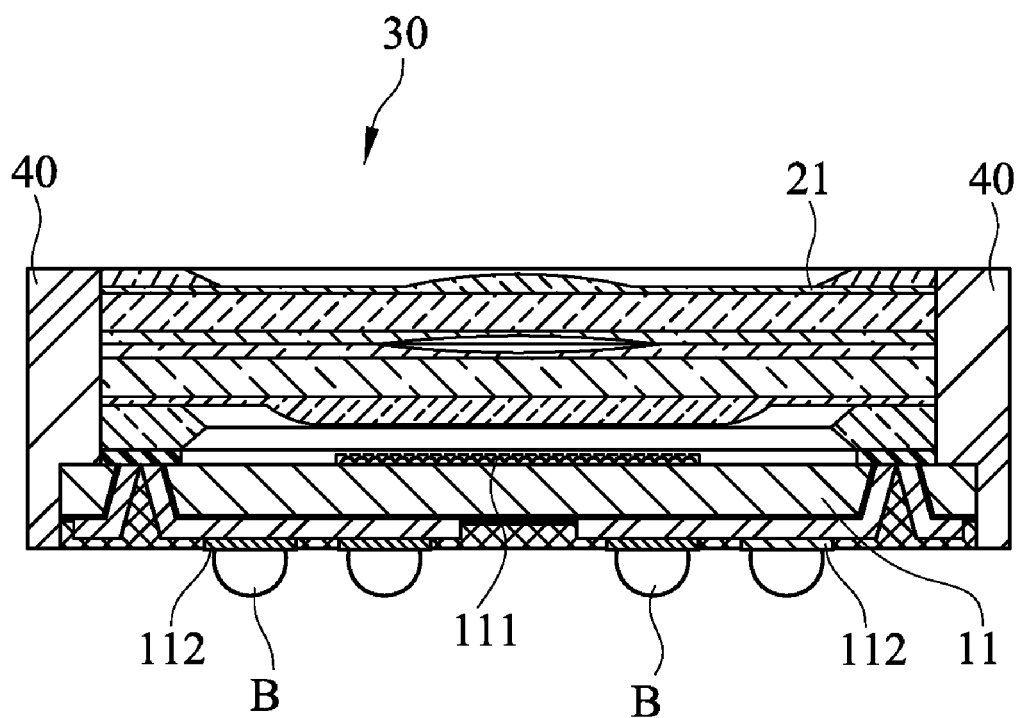
FIG. 13 is a schematic view of a structure of the wafer level image sensor module with package structure according to an embodiment of the present invention.

The step of cutting an encapsulant (S17) is described hereunder. Referring to FIG. 12 and FIG. 13, the encapsulant 40 between the semi-finished products 30 is cut to separate the semi-finished products 30, such that the semi-finished products 30 are each encapsulated around by the encapsulant 40.

Upon completion of the aforesaid steps performed in the embodiment, the image sensor module thus obtained is fully encapsulated by the encapsulant 40 and dispenses with a substrate, a circuit board, or a second glass; as a result, the package structure of the image sensor module thus obtained is of a relatively small package scale, and is of a lesser package height than a conventional package structure is. Using less materials is conducive to cost cutting. Using no additional light masks or masking layers in solving the problem with side light leakage, as well as dispensing with the focusing unit of the fabrication process are thus effective in reducing the costs and work which might otherwise be incurred and required, respectively. Moreover, since each of the semi-finished products 30 is encapsulated with the encapsulant 40, the image sensing chips 11 would not crack easily.

Referring to FIG. 13, the wafer level image sensor module with package structure thus obtained comprises a semi-finished product 30, the plurality of solder balls B, and the encapsulant 40. The semi-finished product 30 comprises the image sensing chip 11 and the wafer level lens assembly 21. The image sensing chip 11 comprises the image sensing region 111 and the plurality of sorldering pads 112. The image sensing region 111 and the sorldering pads 112 are disposed on opposing sides of the image sensing chip 11. The wafer level lens assembly 21 is coupled with the image sensing chip 11 corresponding to the position of the image sensing region 111. The solder balls B are mounted on the sorldering pads 112, respectively. The encapsulant 40 encapsulates around the lateral sides of each semi-finished product 30 to thereby prevent poor image quality, such as flare, which might otherwise arise from light incidence from the lateral side of the wafer level lens assembly 21.

Figure 14:
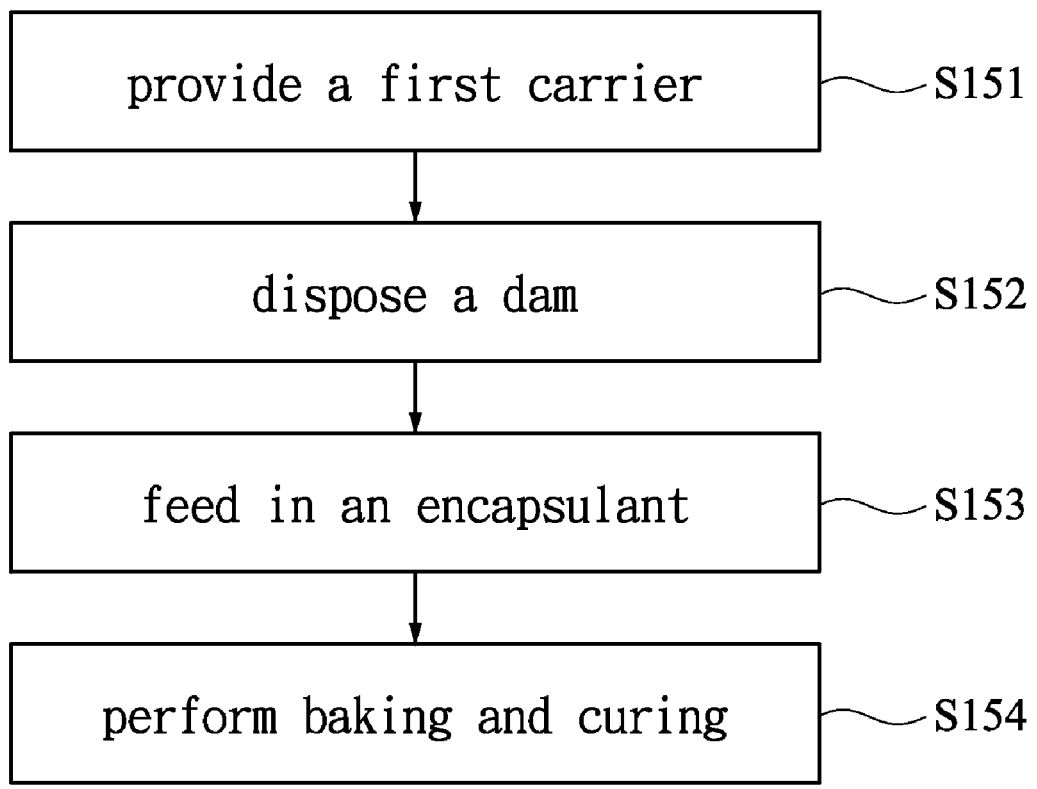
FIG. 14 is a flow chart of a packaging process of the wafer level image sensor module with package structure according to an embodiment of the present invention.
Figure 15:
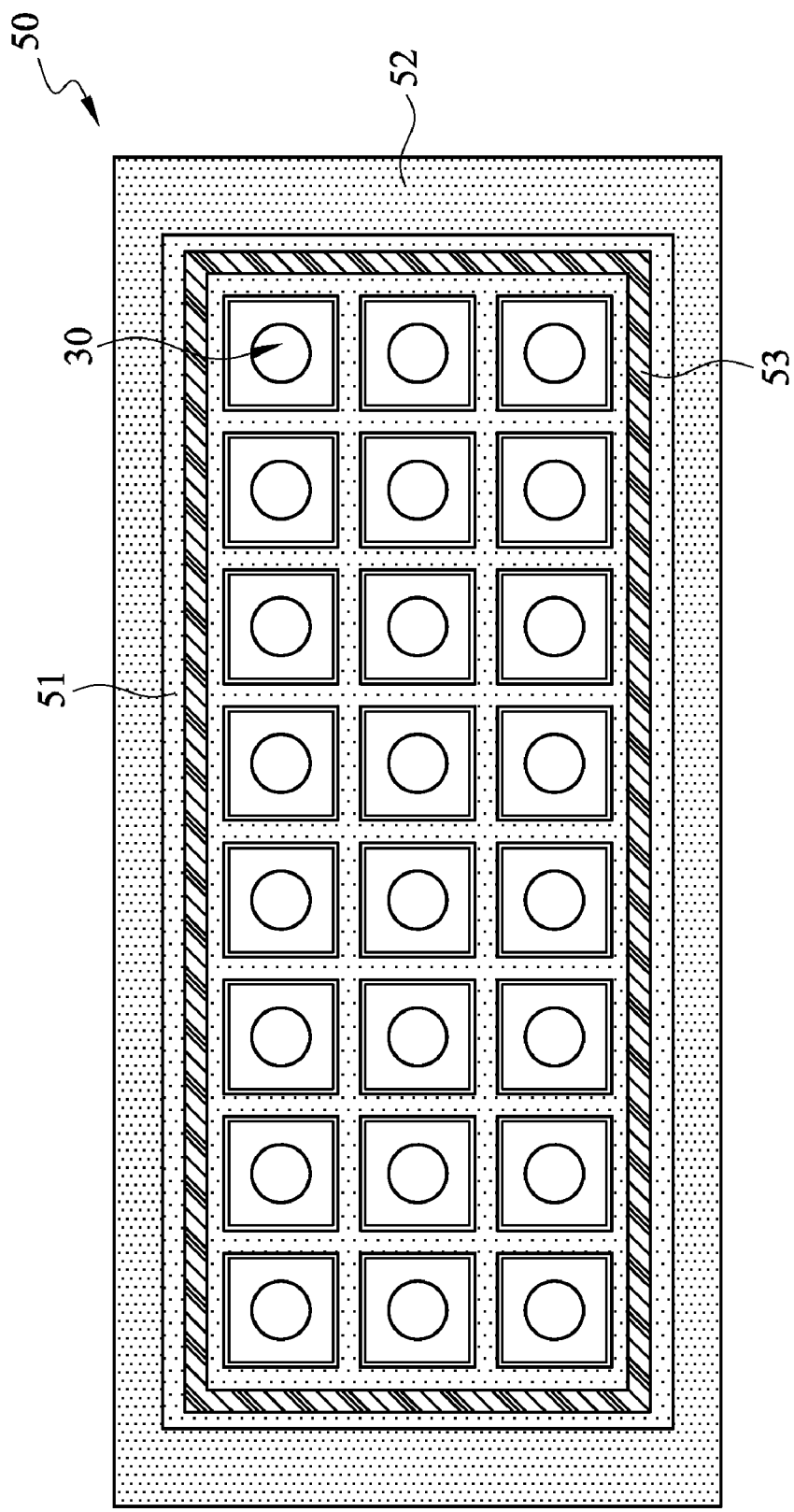
FIG. 15 is a top view of a first carrier of the wafer level image sensor module with package structure according to an embodiment of the present invention.
Figure 16:
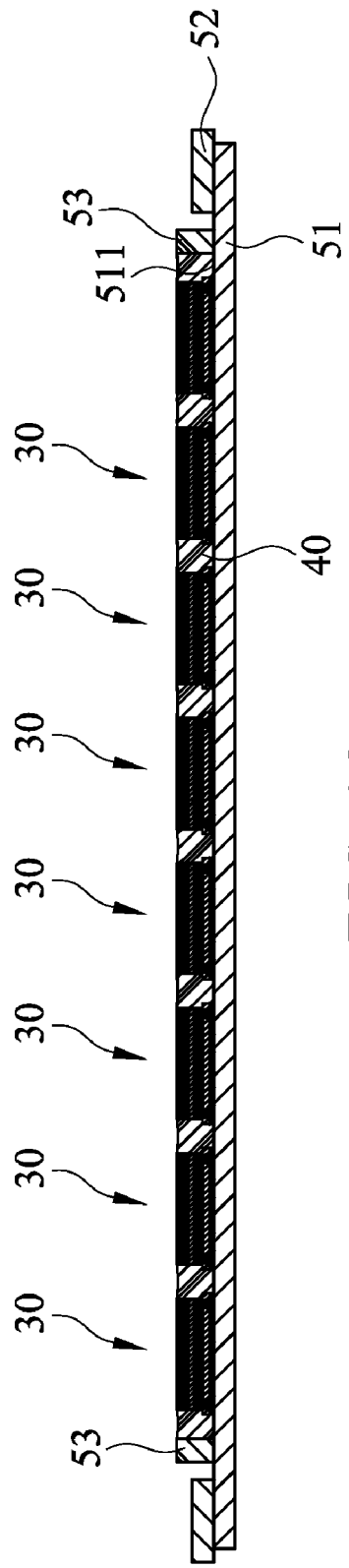
FIG. 16 is a cross-sectional view of the first carrier of the wafer level image sensor module with package structure according to an embodiment of the present invention.

Referring to FIG. 14 through FIG. 16, the packaging process (S15) further comprises the steps of: providing a first carrier (S151); disposing a dam (S152); feeding in an encapsulant (S153); and performing baking and curing (S154).

The step of providing a first carrier (S151) is described hereunder. Referring to FIG. 15 and FIG. 16, the plurality of semi-finished products 30 are put on a first carrier 50, and the first carrier 50 comprises a first film 51 and a first frame 52. The first film 51 has a first adhesive side 511. The first film 51 is attached to one side of the first frame 52, such that the first adhesive side 511 is exposed from inside the first frame 52 and forms a first carrying region. The semi-finished products 30 are arranged in an array within the first carrying region. The semi-finished products 30 are spaced apart from each other by a preset distance. The sides of sorldering pads 112 of the semi-finished products 30 are disposed on the first adhesive side 511.

The step of disposing a dam (S152) is described hereunder. The dam 53 is disposed on the first carrier 50 by forming a circular structure along the periphery of the first carrier 50 to enclose the semi-finished products 30, such that the semi-finished products 30 are bounded by the dam 53. Furthermore, the height of the dam 53 is equal to or slightly less than the total height of the semi-finished products 30.

The step of feeding in an encapsulant (S153) is described hereunder. Referring to FIG. 16, the encapsulant 40 encapsulates the lateral sides of each of the semi-finished products 30, but does not reach the upper edge of the wafer level lens assemblies 21 on top of the semi-finished products 30. Since the bottom sides of the semi-finished products 30 have already been attached to the first film 51 of the first carrier 50, the encapsulant 40 is unlikely to flow to the sorldering pad-disposed sides of the semi-finished products 30.

The step of performing baking and curing (S154) is described hereunder. With the step of performing baking and curing, the encapsulant 40 is cured and shaped, wherein the encapsulant 40 can be a liquid compound.

Figure 17:
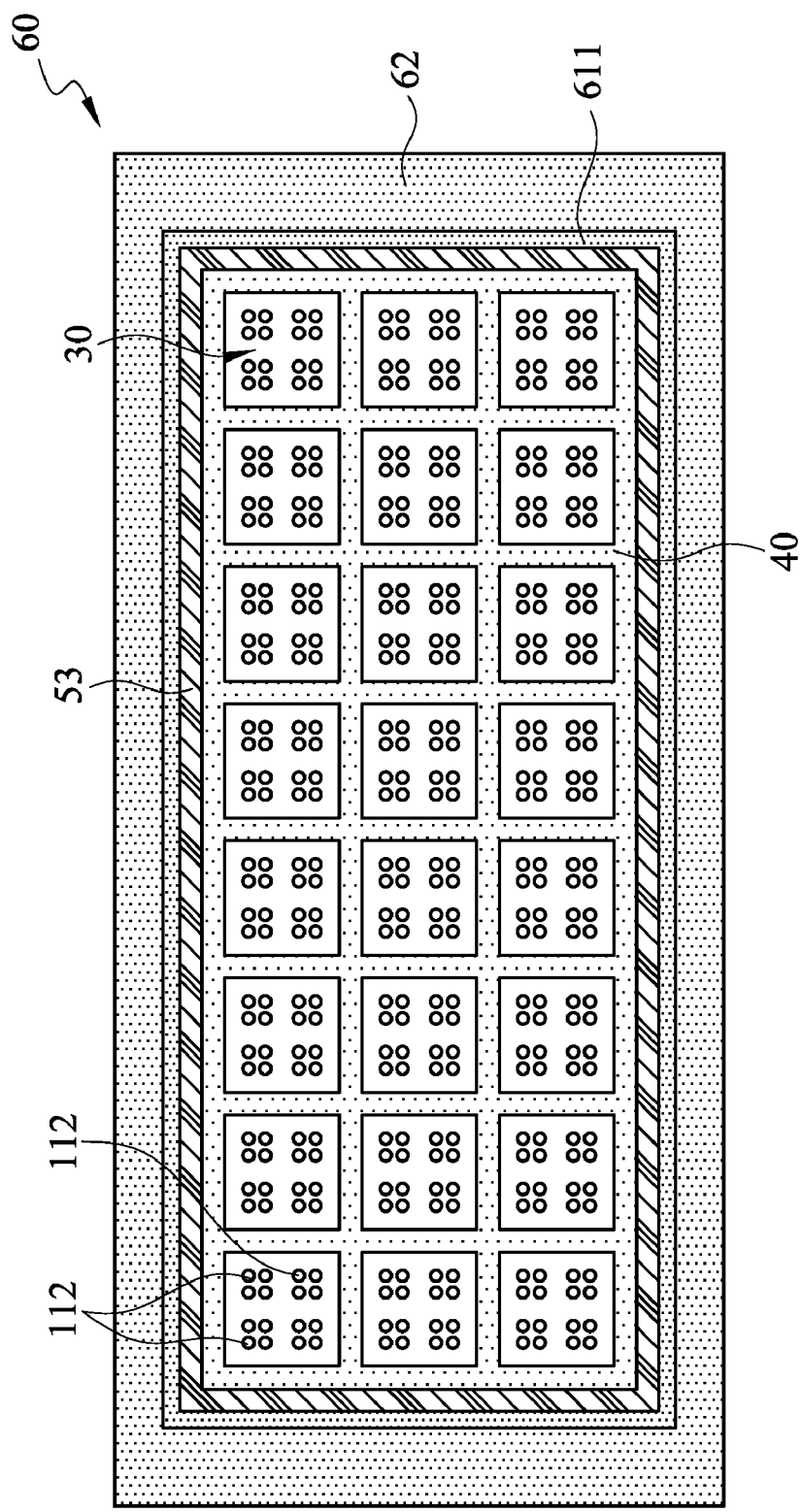
FIG. 17 is a top view of a second carrier of the wafer level image sensor module with package structure according to an embodiment of the present invention.
Figure 18:
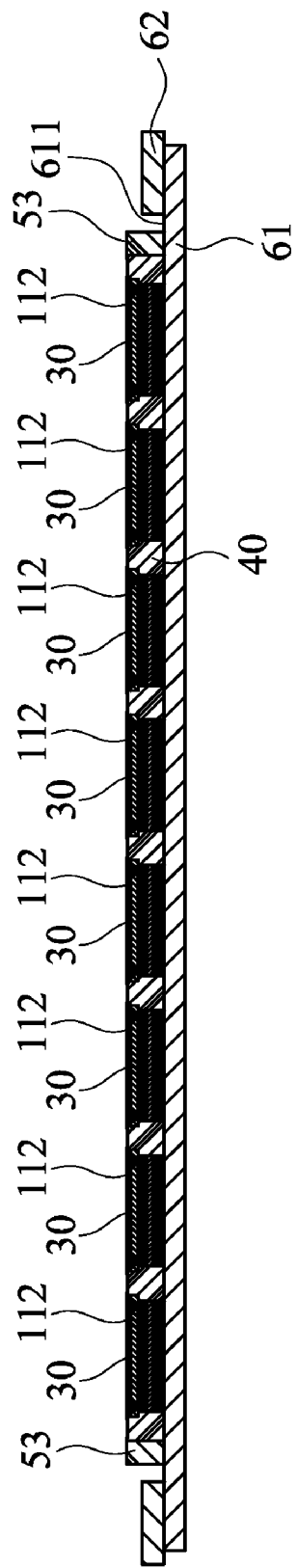
FIG. 18 is a cross-sectional view of the second carrier of the wafer level image sensor module with package structure according to an embodiment of the present invention.

Referring to FIG. 17 and FIG. 18, the step of mounting a plurality of solder balls (S16) further comprises the sub-steps of: placing the semi-finished products 30 that have undergone a packaging process on a second carrier 60; and exposing the sorldering pads 112 of the semi-finished products 30. The second carrier 60 comprises a second film 61 and a second frame 62. The second film 61 has a second adhesive side 611. The second film 61 is attached to one side of the second frame 62, such that the second adhesive side 611 is exposed from inside the second frame 62 and forms a second carrying region. The wafer level lens assembly-disposed sides of the semi-finished products 30 are adhesively attached to the second adhesive side 611. As a result, the sorldering pads 112 are exposed from above, so as to undergo a subsequent solder ball mounting process. The solder balls B disposed on the sorldering pads 112 are arranged in the form of a ball grid array (BGA). Accordingly, the wafer level image sensor module with package structure is finalized as shown in FIG. 13.

Figure 19:
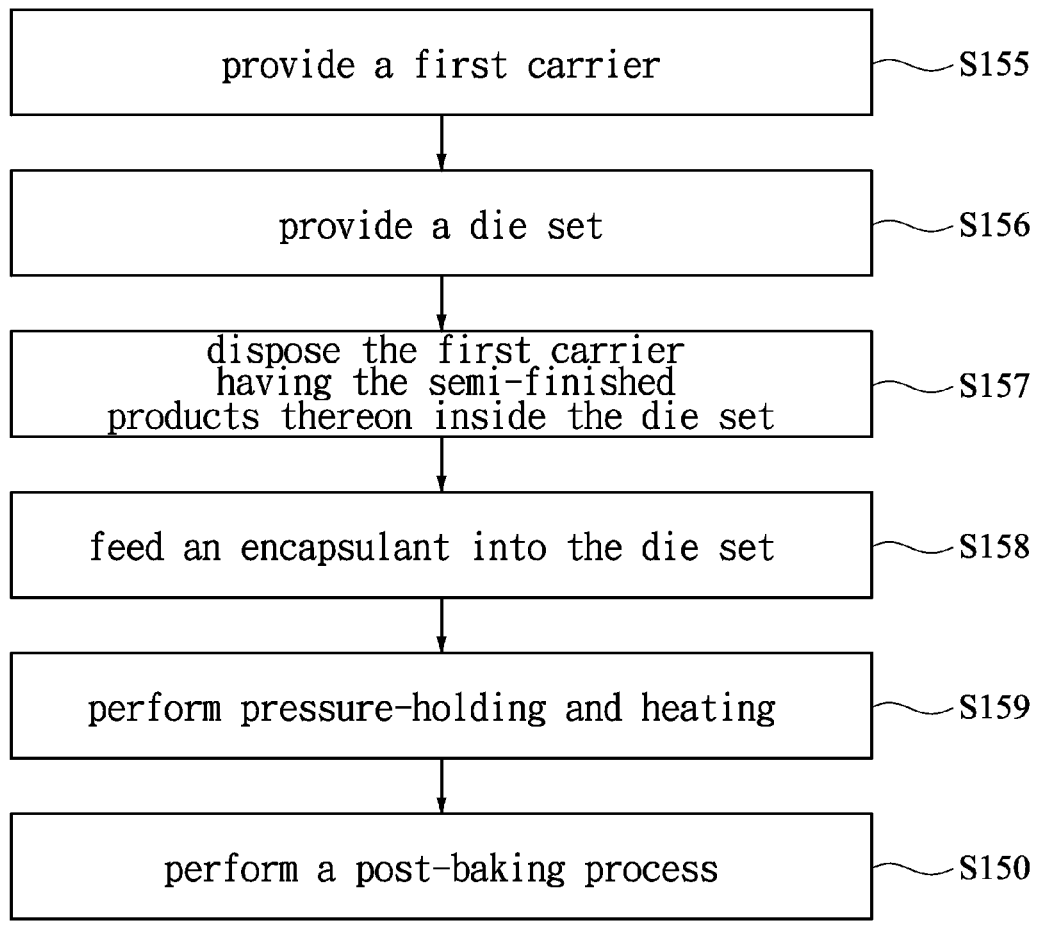
FIG. 19 is a flow chart of a packaging process of the wafer level image sensor module with package structure according to another embodiment of the present invention.

Referring to FIG. 19, in this embodiment, another packaging process (S15), whereby the encapsulant 40 is fixed to the periphery of the semi-finished products 30, comprises the steps of: providing a first carrier (S155); providing a die set (S156); disposing the first carrier having the semi-finished products thereon inside the die set (S157); feeding an encapsulant into the die set (S158); performing pressure-holding and heating (S159); and performing a post-baking process (S150).

The step of providing a first carrier (S155) is described hereunder. Referring to FIG. 15 and FIG. 16, the first carrier 50 is configured to carry the semi-finished products 30. The first carrier 50 in step S155 is of the same structure as the first carrier 50 in step S151 and thus is not described hereunder in detail.

Figure 20:
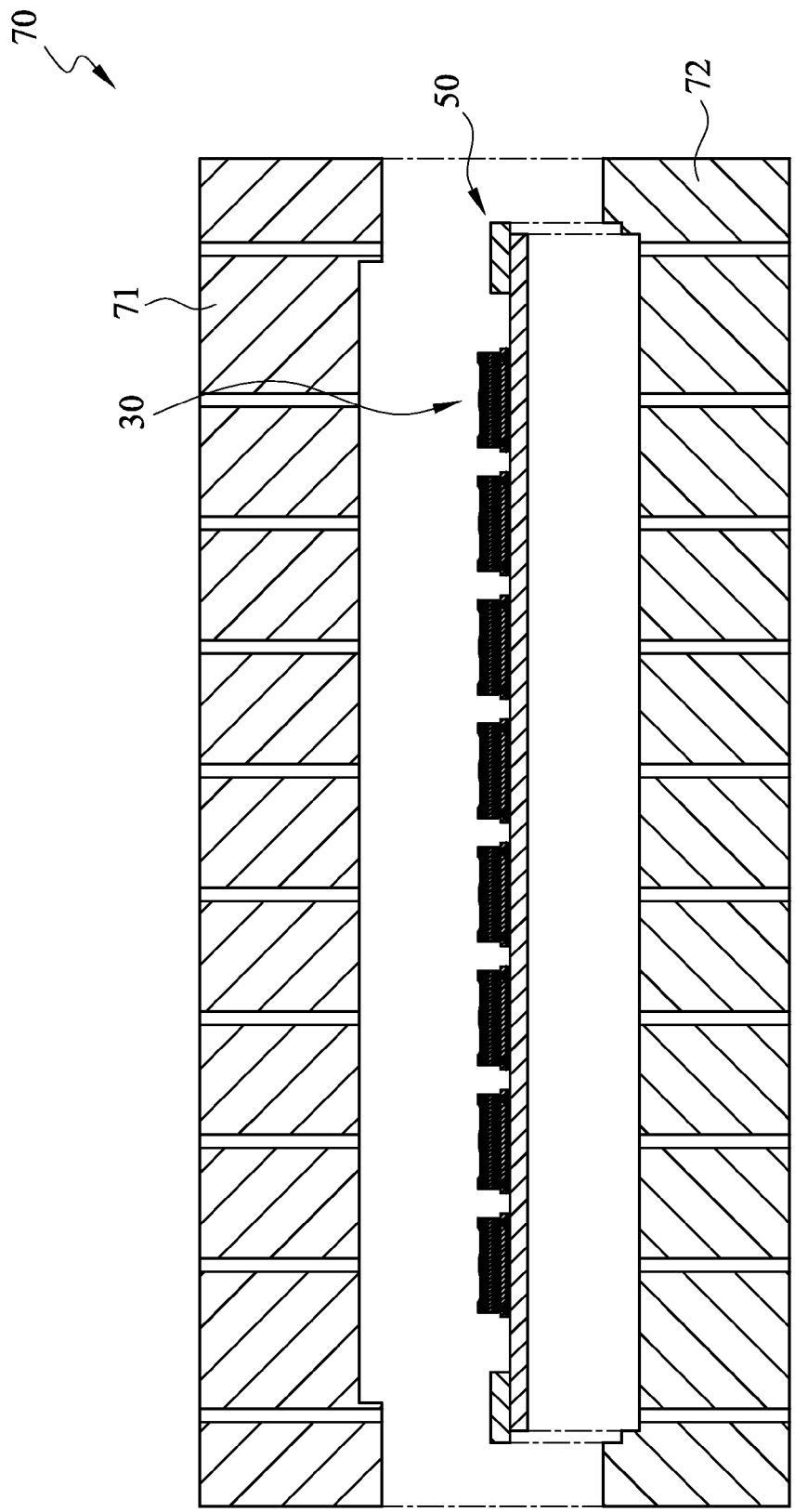
FIG. 20 is a schematic view of a die set of the wafer level image sensor module with package structure according to an embodiment of the present invention.
Figure 21:
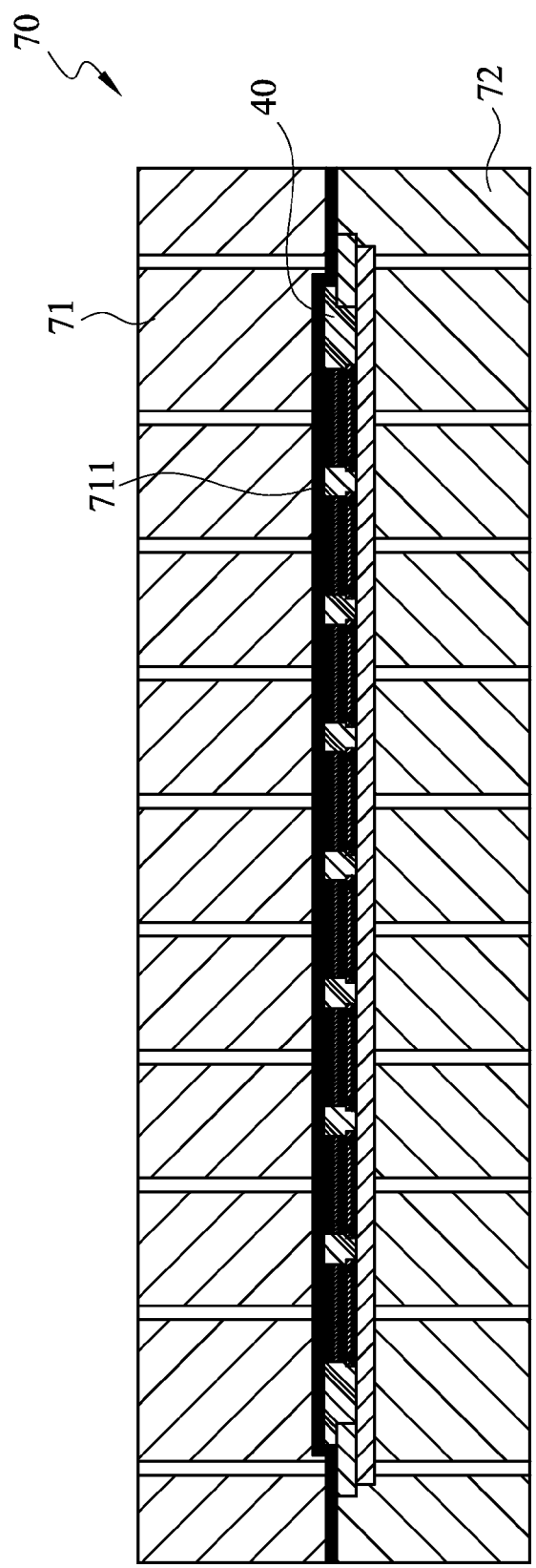
FIG. 21 is a schematic view of the encapsulant-filled die set of the wafer level image sensor module with package structure according to an embodiment of the present invention.

The step of providing a die set (S156) is described hereunder. As shown in FIG. 20 and FIG. 21, a die set 70 comprises a first die 71 and a second die 72. The first die 71 and the second die 72 can be coupled together such that a receiving space is formed therebetween for receiving the first carrier 50.

The step of disposing inside the die set the first carrier having the semi-finished products thereon (S157) is described hereunder. As shown in FIG. 20 and FIG. 21, after the first carrier 50 having the semi-finished products 30 thereon has been disposed inside the die set 70, the first die 71 abuts against one end of each of the semi-finished products 30, and the second die 72 abuts against one side of the first carrier 50.

The step of feeding an encapsulant into the die set (S158) is described hereunder. Referring to FIG. 21, the encapsulant 40 is fed into the die set 70, such that the encapsulant 40 encapsulates each of the semi-finished products 30 by being disposed on the lateral sides of each of the semi-finished products 30. With the first die 71 abutting against one end of each of the semi-finished products 30 (that is, the top side of the wafer level lens assembly 21) and the first carrier 50 abutting against the lower end of the image sensing chip 11 (that is, the sorldering pad-disposed sides thereof), the encapsulant 40 merely encapsulates lateral sides of each of the semi-finished products 30, but does not cover the wafer level lens assemblies 21 from above.

The step of performing pressure-holding and heating (S159) is described hereunder. The feeding-in of the encapsulant 40 is followed by the shaping of the encapsulant 40 and then followed by the step of performing a post-baking process (S150), so as to cure the encapsulant 40. The encapsulant 40 used in step S159 and step S150 can be a mold compound.

Referring to FIG. 21, the first die 71 further comprises a vacuum adsorption buffer layer 711 whereby the first die 71 tightly abuts against the top sides of the semi-finished products 30.

Furthermore, the silicon wafer 10 is a through-silicon vias (TSV) wafer. With the TSV process technology, the silicon wafer 10 not only dispenses with a COB process substrate, but also reduces the required total height of a structure of an image sensor module.

Accordingly, a wafer level image sensor module with package structure according to the present invention is advantageously characterized by: encapsulation of image sensors with an encapsulant 40; reduction of package scale, package height, required materials, and costs; no extra light mask or masking layer required; no focusing unit required; and prevention of image sensing chip 11 cracking.

The foregoing embodiments are provided to illustrate and disclose the technical features of the present invention so as to enable persons skilled in the art to understand the disclosure of the present invention and implement the present invention accordingly, and are not intended to be restrictive of the scope of patent protection given to the present invention. Hence, all equivalent modifications and variations made to the foregoing embodiments without departing from the spirit embodied in the disclosure of the present invention should fall within the scope of the present invention as set forth in the appended claims.

What is claimed is:

1. A manufacturing method of a wafer level image sensor module with package structure, the method comprising the steps of:
providing a silicon wafer comprising a plurality of image sensing chips, the image sensing chips each comprising an image sensing region and a plurality of sorldering pads;
dicing the silicon wafer to divide the silicon wafer into the image sensing chips;
providing a lens assembly wafer comprising a plurality of wafer level lens assemblies;
fabricating a plurality of semi-finished products each have at least one said wafer level lens assembly, wherein the wafer level lens assembly corresponds in position to at least one said image sensing region and is disposed on a corresponding one of the image sensing chips so as to be coupled thereto;
performing a packaging process by filling an encapsulant between the semi-finished products such that the encapsulant only encapsulates a lateral side of each of the semi-finished products;
mounting solder balls on the sorldering pads; and
cutting the encapsulant between the semi-finished products so as to separate the semi-finished products.

2. The method of claim 1, wherein the packaging process comprises the steps of:
providing a first carrier for carrying the plurality of semi-finished products thereon;
disposing a dam, wherein the dam is disposed on the first carrier and configured to enclose the semi-finished products;
feeding in the encapsulant, wherein the encapsulant is a liquid compound; and
performing baking and curing on the encapsulant, so as for the encapsulant to take shape.

3. The method of claim 2, wherein the first carrier comprises a first film and a first frame, the first film having a first adhesive side and being attached to a side of the first frame, such that the first adhesive side is exposed from inside the first frame and forms a first carrying region.

4. The method of claim 3, wherein the semi-finished products are arranged in an array within the first carrying region, and the sorldering pad-disposed sides of the semi-finished products are disposed on the first adhesive side.

5. The method of claim 4, wherein the step of mounting the solder balls further comprises the sub-steps of: placing the semi-finished products that have undergone the packaging process on a second carrier; and exposing the sorldering pads of the semi-finished products.

6. The method of claim 5, wherein the second carrier comprises a second film and a second frame, the second film having a second adhesive side and being attached to a side of the second frame, such that the second adhesive side is exposed from inside the second frame and forms a second carrying region, and the wafer level lens assemblies of the semi-finished products are adhesively attached to the second adhesive side.

7. The method of claim 6, wherein the sorldering pads and the image sensing region are disposed on opposite sides of the image sensing chip.

8. The method of claim 7, wherein the solder balls disposed on the sorldering pads are arranged in form of a ball grid array (BGA).

9. The method of claim 8, wherein the silicon wafer is a through-silicon vias (TSV) wafer.

10. The method of claim 1, wherein the packaging process comprises the steps of:
providing a first carrier for carrying the semi-finished products thereon;
providing a die set comprising a first die and a second die;
disposing the first carrier having the semi-finished products thereon between the first die and the second die, the first die abutting against ends of the semi-finished products, and the second die abutting against a side of the first carrier;
feeding the encapsulant into the die set, so as for the encapsulant to encapsulate lateral sides of the semi-finished products, wherein the encapsulant is a mold compound;

performing pressure-holding and heating, so as for the encapsulant to take shape; and performing a post-baking process for curing the encapsulant.

11. The method of claim 10, wherein the first die further comprises a vacuum adsorption buffer layer.

12. The method of claim 11, wherein the first carrier comprises a first film and a first frame, the first film having a first adhesive side and being attached to a side of the first frame, such that the first adhesive side is exposed from inside the first frame and forms a first carrying region.

13. The method of claim 12, wherein the semi-finished products are arranged in an array within the first carrying region, and the sorldering pad-disposed sides of the semi-finished products are disposed on the first adhesive side.

14. The method of claim 13, wherein the step of mounting the solder balls further comprises the sub-steps of: placing the semi-finished products that have undergone the packaging process on a second carrier; and exposing the sorldering pads of the semi-finished products.

15. The method of claim 14, wherein the second carrier comprises a second film and a second frame, the second film having a second adhesive side and being attached to a side of the second frame, such that the second adhesive side is exposed from inside the second frame and forms a second carrying region, and the wafer level lens assemblies of the semi-finished products are adhesively attached to the second adhesive side.

16. The method of claim 15, wherein the sorldering pads and the image sensing region are disposed on opposite sides of the image sensing chip.

17. The method of claim 16, wherein the solder balls disposed on the sorldering pads are arranged in form of a ball grid array (BGA).

18. The method of claim 17, wherein the silicon wafer is a through-silicon vias (TSV) wafer.

19. A structure of a wafer level image sensor module with package structure, comprising:
    a semi-finished product, comprising:
    an image sensing chip comprising an image sensing region and a plurality of sorldering pads, wherein the image sensing region and the sorldering pads face opposite directions;
    a wafer level lens assembly coupled to the image sensing chip and corresponding in position to the image sensing region; and
    a plurality of solder balls mounted on the sorldering pads, respectively; and
    an encapsulant for encapsulating each of the semi-finished products by being disposed on lateral sides thereof;
    wherein the encapsulant is one of a mold compound and a liquid compound.

20. The structure of claim 19, wherein the solder balls disposed on the sorldering pads are arranged in form of a ball grid array (BGA).

* * * * *